United States Patent [19]

Vesterinen

[11] Patent Number: 5,256,919

[45] Date of Patent: Oct. 26, 1993

[54] METHOD FOR PREVENTING THE OSCILLATION OF AN RF POWER MODULE

[75] Inventor: Jukka Vesterinen, Äänekoski, Finland

[73] Assignee: Heikka Marttila Oy, Jyvaskyla, Finland

[21] Appl. No.: 15,895

[22] Filed: Feb. 11, 1993

Related U.S. Application Data

[63] Continuation of Ser. No. 701,241, May 16, 1991, abandoned.

[30] Foreign Application Priority Data

Jun. 5, 1990 [FI] Finland ............... 902812

[51] Int. Cl.$^5$ ............... H03K 17/16; H03K 19/003
[52] U.S. Cl. ............... 307/557; 307/443; 307/549; 307/102
[58] Field of Search ............... 307/443, 557, 549, 573, 307/100, 102

[56] References Cited

U.S. PATENT DOCUMENTS

| | | | |
|---|---|---|---|
| 3,033,994 | 5/1962 | Fujimoto et al. | 307/557 |
| 4,216,432 | 8/1980 | Imazeki et al. | 455/79 |
| 4,417,165 | 11/1983 | Fujibayashi | 307/540 |
| 4,525,637 | 6/1985 | Sano et al. | 307/557 |
| 4,858,055 | 8/1989 | Okitaka | 307/557 |
| 4,992,675 | 2/1991 | Conner, Jr. et al. | 307/549 |

FOREIGN PATENT DOCUMENTS

| | | |
|---|---|---|
| 0246640 | 11/1987 | European Pat. Off. |
| 3018604 | 11/1980 | Fed. Rep. of Germany |
| 47471 | 4/1979 | Japan |

OTHER PUBLICATIONS

Nuclear Instruments & Methods in Physics Research, vol. 169, No. 3, pp. 601-604, Mar. 1980.

Primary Examiner—Edward P. Westin
Assistant Examiner—Richard Roseen
Attorney, Agent, or Firm—Armstrong, Westerman, Hattori, McLeland & Naughton

[57] ABSTRACT

The invention relates to a method and a circuit arrangement for preventing the oscillation of a radio frequency power module (IC1). According to the method of the invention a coupling element (Q7), preferably a bipolar transistor, which is made conductive when the input signal (IN) is removed, is installed between the input (IN) and the ground. The supply voltage (VS) in the power module can be permanently switched on.

4 Claims, 1 Drawing Sheet

Fig.1
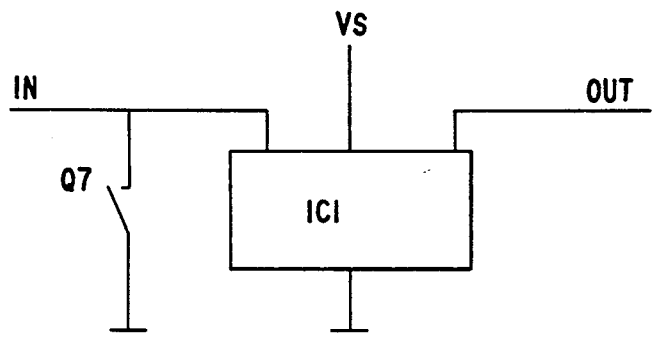
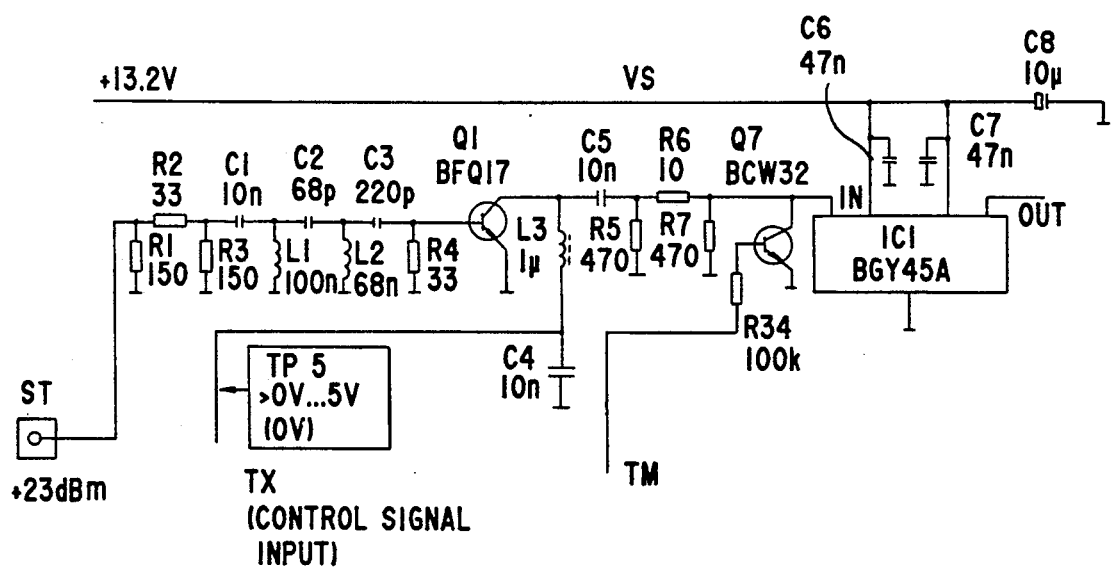
Fig.2

METHOD FOR PREVENTING THE OSCILLATION OF AN RF POWER MODULE

This application is a continuation of application Ser. No. 07/701,241 filed May 16, 1991, now abandoned.

The invention relates to a method and a circuit arrangement for preventing the oscillation of a high frequency power module, specially relating to radiotelephone sets.

In radiotelephone transmitter sets, e.g. in portable or mobile telecommunications equipment, a transmitting circuit can use an integrated radio frequency (RF) power amplifier module, which operates for example on a wideband basis on HF, VHF or UHF ranges.

The operation of such a power module is controlled by an input signal, i.e. a power adjusting control, when the set is in an active transmitting state. Control is not being fed to the power module while it is in a stand-by state; i.e., the module is in an uncontrolled state. In this case the module may start to oscillate. The potential oscillation has to be prevented because of the problems caused by oscillation.

In the conventional method, the supply voltage of the power module has been under control; i.e. the supply voltage has been disconnected when the control has been removed from the module. Such operation requires, however, switching off high current and accordingly providing costly switching components, which are high current resistant.

The object of the invention is to provide a simple and advantageous method for preventing the oscillation of a radio frequency power module when the input signal; i.e., the control, is removed therefrom.

This purpose is achieved according to the invention by the method according to the features of claim number 1. The method according to the invention can be implemented in a simple manner and using advantageous components. Furthermore, according to the invention, the supply voltage in the power module can be permanently switched on.

Other preferred embodiments of the invention are described in the dependent claims.

The invention is described in the following by an exemplary embodiment with reference to the accompanying drawing, in which FIG. 1 shows diagrammatically the method according to the invention implemented by the circuit arrangement, and FIG. 2 shows a more detailed implementation of the circuit arrangement illustrated in FIG. 1.

A radio frequency power module IC1 is illustrated in FIG. 1. The supply voltage is VS, the input signal; i.e., the power adjusting control, is indicated by IN, and the amplified output of the power signal generated by the power module, respectively, is indicated by OUT. According to the method of the invention a coupling element Q7, preferably a bipolar transistor, which is made conductive when the input signal IN is removed, is installed between the input and the ground. The transistor Q7 is made unconductive when the input signal is active. Since the power levels used in the input are in the range of 1/1000 of the power level of the output and of the input power VS, respectively, it is clear that the coupling element Q7 can be chosen as a much more advantageous low-power component than the power switch which can be used to control the supply voltage.

A more detailed circuit arrangement is illustrated in FIG. 2, where the power module IC1 is of type BGY45A with a frequency range between 68...88 MHz, a supply voltage of 10...15 V and a nominal output power of 29 W. The input is controlled by power level of 10 . . . 150 mW. The manufacturer of this circuit discloses that the power module should be stable; i.e., non-oscillating also without control, i.e. when the input power =0,0 mW. Practice has proven, however, that oscillation occurs, which can be prevented according to the invention by the arrangement of the input with the bipolar transistor Q7.

The transistor Q1 in FIG. 2 operates as a power control unit. TX is in reference to a control signal inputted to a control input of the control unit, wherein the control signal TX originates from, e.g., radio-telephone transmitter sets. The signal TM is the signal transmitted into the base of the transistor Q7. The signal ST is a high frequency signal, the power level of which remains constant. The signal ST is the signal to be amplified with the power module. By adjusting its operating voltage, the RF input signal coming to the power module IC1 is changed. When the module is not controlled; i.e., the control signal TX of Q1 (inputted to a control input of the control unit)=off, Q7 is placed into a conductive state by connecting (e.g., a voltage of +5 V) via resistor R34 into its base (TM=on). When the module is given control power (i.e., the control signal TX of Q1 inputted to the control input of the control unit is on) (TX=on), Q7 is made unconductive by connecting a voltage of 0 V via R34 to its base (TM=off).

Preferably a logical circuit (not shown) is arranged to control the control signals TX and TM so that TM is a logical negation of signal TX (TM=TX).

While the invention has been particularly shown and described in reference to preferred embodiments thereof, it will be understood by those skilled in the art that changes in form and details may be made therein without departing from the spirit and scope of the invention.

I claim:

1. A method for preventing oscillation of an RF power module, comprising the steps of:
   (1) switching OFF a control unit, and connecting an input of said module to a ground; and
   (2) switching ON said control unit, and disconnecting said input of said module from said ground, wherein a signal in said control unit of a logical negation of another signal in said input of said module, wherein the step of switching ON or OFF said control unit, and the step of connecting or disconnecting said input of said module to or from said ground substantially occur via a common circuit.

2. The method according to claim 1, further comprising the step of permanently connecting an operating voltage of said module.

3. A circuit for preventing oscillation of an RF power module when an operating voltage of said module is permanently connected during operation, comprising:
   a control means connected to an input of said module;
   a coupling element operably connected to said input of said module for connecting or disconnecting said input of said module to or from ground, wherein said control means is coupled to said coupling element, wherein said coupling element connects said input of said module to said ground when said control means turns OFF said module, wherein said coupling element disconnects said input of said module from said ground when said control means turns ON said module, and wherein a control signal in said control means is a logical negation of another signal in said controls means, wherein said control signal and said another signal are substantially formed via a common circuit.

4. The circuit according to claim 3, wherein said coupling element is a low power transistor.

* * * * *